(12) United States Patent
Little

(10) Patent No.: US 7,253,428 B1
(45) Date of Patent: Aug. 7, 2007

(54) APPARATUS AND METHOD FOR FEATURE EDGE DETECTION IN SEMICONDUCTOR PROCESSING

(75) Inventor: Joseph R. Little, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 468 days.

(21) Appl. No.: 09/542,782

(22) Filed: Apr. 4, 2000

(51) Int. Cl.
*G01V 8/00* (2006.01)

(52) U.S. Cl. ............................ 250/559.44; 257/698

(58) Field of Classification Search .......... 250/559.01, 250/559.05, 559.06, 559.07, 559.39, 559.4, 250/559.43, 559.44, 566, 568; 356/620, 356/401, 237.4, 237.5; 257/797, 48; 438/401, 438/975

See application file for complete search history.

(56) References Cited

U.S. PATENT DOCUMENTS

| | | | | |
|---|---|---|---|---|
| 4,348,803 A | 9/1982 | Sasaki | .................... | 438/479 |
| 4,585,931 A | 4/1986 | Duncan et al. | ........ | 235/462.14 |
| 4,631,416 A | 12/1986 | Trutna, Jr. | .................... | 250/548 |
| 4,896,034 A | 1/1990 | Kiriseko | ...................... | 250/271 |
| 4,991,962 A | 2/1991 | Jain | ............................ | 356/490 |
| 5,175,774 A | 12/1992 | Truax et al. | ................. | 382/145 |
| 5,265,170 A | 11/1993 | Hine et al. | ................... | 382/145 |
| 5,343,292 A | 8/1994 | Brueck et al. | .............. | 356/509 |
| 5,361,150 A * | 11/1994 | Noguchi | ..................... | 349/84 |
| 5,386,481 A | 1/1995 | Hine et al. | ................... | 382/145 |
| 5,610,104 A | 3/1997 | Mitchell | ...................... | 428/428 |
| 5,705,320 A | 1/1998 | Hsu et al. | .................... | 430/313 |
| 5,831,738 A | 11/1998 | Hine | ........................... | 356/399 |
| 5,852,497 A * | 12/1998 | Pramanik et al. | ........... | 356/401 |
| 5,889,593 A * | 3/1999 | Bareket | ....................... | 356/445 |
| 6,259,525 B1 * | 7/2001 | David | ......................... | 356/399 |
| 6,366,639 B1 * | 4/2002 | Ezaki et al. | .................. | 378/34 |
| 6,501,189 B1 * | 12/2002 | Kim et al. | .................. | 257/797 |

* cited by examiner

*Primary Examiner*—Thanh X. Luu
*Assistant Examiner*—Stephen Yam
(74) *Attorney, Agent, or Firm*—TraskBritt

(57) ABSTRACT

A system for identifying a mark or other recess formed in a substrate and at least partially covered by at least one layer of opaque or visibly opaque material. The system includes a radiation source configured and positioned to direct incident electromagnetic radiation of at least one wavelength toward the substrate, a reflectometer positioned so as to receive electromagnetic radiation reflected from a location of the substrate, and at least one processor associated with the reflectometer for analyzing an intensity of electromagnetic radiation of each wavelength of radiation reflected from the substrate. The radiation source may direct incident radiation including a range of wavelengths toward a substrate. The system may also include a processor programmed to effect the storage of locations where a measured intensity of one or more wavelengths of radiation reflected from the substrate vary from a baseline intensity of the same wavelength or wavelengths of radiation reflected from a substantially planar location of the same substrate, as well as processors that are programmed to map these locations and to characterize or identify a mark or recess based on such mapping. A method of identifying a mark or other recess formed in a substrate is also disclosed.

60 Claims, 7 Drawing Sheets

APPARATUS AND METHOD FOR FEATURE EDGE DETECTION IN SEMICONDUCTOR PROCESSING

BACKGROUND OF THE INVENTION

1. Field of the Invention

The present invention relates to methods and apparatus for detecting marks or indicia formed in substrates. In particular, the present invention relates to methods and apparatus for detecting marks or indicia formed in substrates and covered by one or more material layers.

2. Background of Related Art

Semiconductor devices and the various structures thereof are fabricated on semiconductor substrates, such as wafers and other large-scale substrates that include a layer of semiconductive material, such as silicon, gallium arsenide, or indium phosphide. Typically, large numbers of a single type of semiconductor device are fabricated on a large-scale substrate, such as a wafer. While many types of semiconductor devices are fabricated in large quantities, on a large number of wafers, to maximize the efficiency with which fabrication equipment is utilized, some types of semiconductor devices are fabricated in relatively small quantities, on only one or a few wafers.

In order to maximize the throughput of fabrication equipment during fabrication of semiconductor devices in small quantities, fabrication process steps that are not specific to a certain type of semiconductor device, such as material layer deposition processes, it is desirable to simultaneously perform these processes on a plurality of wafers, regardless of the type of semiconductor devices being fabricated on each wafer. To accomplish this task, each wafer must be separated from the other wafers with which it is grouped prior to device-specific processes (e.g., patterning of material layers), then routed and transferred to a process location appropriate for the type of semiconductor device being fabricated thereon.

The substrates on which semiconductor devices are produced are typically marked with characters or other indicia that identify the types of semiconductor devices being fabricated thereon. These marks are then identified following the performance of fabrication process steps that are not device specific so that the substrates may be routed to locations where appropriate device specific fabrication processes may be performed. Such marks are typically recessed in the substrate or in a material layer over the substrate. For example, these marks may be etched or laser ablated into the substrate or a material layer thereover. Characters (e.g., numbers) may be formed of a group of small holes in a dot-matrix type arrangement.

Conventionally, the marks on substrates have been identified by directing a narrow wavelength range of light, often from a red, green, or amber light-emitting diode (LED) source, toward the substrate at a location where the marks should be located. A camera, such as a charge-coupled device (CCD) type camera, optically analyzes the illuminated marks. The optically analyzed marks are then identified by a computer executing optical character recognition (OCR) or similar software. As a backup, images of the marks may also be visually displayed for human scrutiny.

While such conventional mark reading apparatus are useful for detecting substrate marks that remain substantially uncovered with material or that are covered with very thin layers or with layers of some visually transparent or translucent materials, this type of equipment cannot be used to identify marks that are covered with one or more layers of visibly opaque materials or even with some translucent materials. It is also difficult to identify marks formed in a substrate, such as silicon, when transparent or translucent materials (e.g., silicon oxides) of very similar color are disposed thereover. As a consequence, prior to routing substrates to a device-specific fabrication process location, it is often necessary to remove material layers from the portion of a substrate where marks are believed to be located. These additional material removal processes are, however, somewhat undesirable.

U.S. Pat. No. 4,896,034, issued to Kiriseko on Jan. 23, 1990 (hereinafter "the '034 patent") discloses a method whereby a bar code formed in a silicon wafer and covered by one or more material layers is identified by directing one or more infrared wavelengths of electromagnetic radiation toward the bar code through the back side of the substrate. As silicon is relatively transparent to infrared wavelengths of electromagnetic radiation, the infrared radiation readily travels therethrough without a significant degree of reflectance or absorption. An infrared radiation detector is positioned so as to detect only the infrared radiation reflected from the recesses of the bar code. The method of the '034 patent can, however, only be employed to read marks or indicia through the back side of the wafer and not from the more readily accessible active surface of the wafer. Furthermore, the '034 patent only teaches a method for reading bar codes, not for identifying other types of marks, such as characters, or other indicia recessed in a substrate or in a layer disposed over the substrate.

The inventor of the subject matter disclosed herein is unaware of any teaching in the art of a method or an apparatus for identifying marks or indicia through one or more opaque or visibly opaque material layers.

SUMMARY OF THE INVENTION

The present invention includes a method for identifying marks or indicia that are formed in a substrate or a material layer thereover and that are covered with one or more opaque or visibly opaque material layers. Apparatus for effecting the method of the present invention are also within the scope of the present invention.

The method of the present invention includes scanning across a location of a substrate where one or more marks comprising recesses or cavities in the surface of the substrate or material thereon are believed to be located, electromagnetic radiation of a specific wavelength or of various wavelengths within a specific range. The recesses or cavities defining the mark or marks may be covered with one or more material layers. The intensity, or reflectance, of each wavelength of electromagnetic radiation reflected by the substrate or the material layers formed therein is measured as electromagnetic radiation is being scanned onto the substrate. A change in the reflectance of one or more reflected wavelengths of electromagnetic radiation indicates a change in thickness of one or more material layers or of a recess or cavity formed in the substrate or a material layer disposed thereover and filled with a different material, each of which indicates the presence of a mark. Data of the locations of marks are correlated to detect the marks, the identities of which may then be recognized.

A system incorporating teachings of the present invention includes at least one source of electromagnetic radiation, a reflectometer, and a detector associated with the reflectometer. An actuation element moves the light source and reflectometer relative to the substrate or the substrate relative to the light source and reflectometer to facilitate scanning of the light source and reflectometer relative to the substrate. The detector may include a processor operating under instructions from a program to monitor and sense changes in a reflectance of one or more wavelengths of electromagnetic radiation reflected by the substrate or a material layer thereon and measured by the reflectometer. Preferably, the detector includes memory to store information regarding the locations on the substrate from which electromagnetic radiation of one or more wavelengths is reflected at a reflectance that varies from a baseline intensity, or reflectance, as measured at regions of the substrate where neither marks nor semiconductor device structures are located. This stored information represents locations on the substrate where at least portions of marks are present. The system may also include a component that analyzes, or correlates, the information representing the locations of portions of marks on the substrate to facilitate identification of the marks. This component may comprise a processor, in this capacity operating under instructions from a data plotting program. The identities of the marks may also be recognized by the component, which may comprise a processor operating under instructions from an optical character recognition or similar program.

Other features and advantages of the present invention will become apparent to those in the art through a consideration of the following description, the accompanying drawings, and the appended claims.

DETAILED DESCRIPTION OF THE INVENTION

Figure 1:
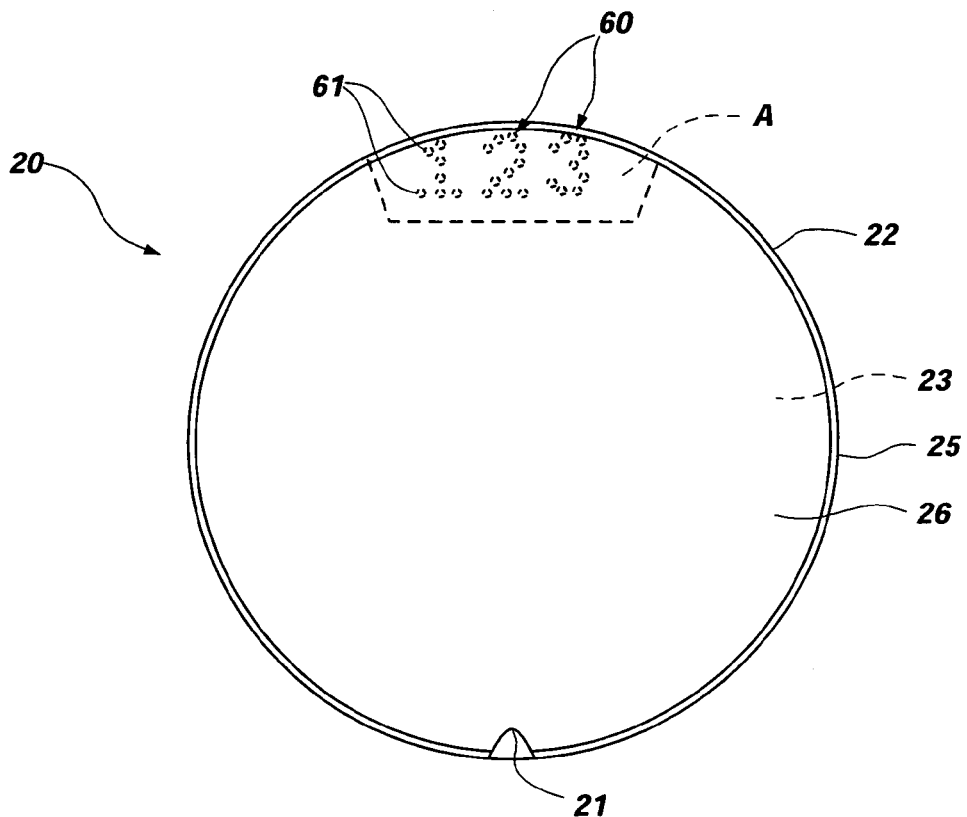
FIG. 1 is a schematic top representation of a substrate, in this case a semiconductor wafer, including a mark that may be identified using the method or system of the present invention.
Figure 3:
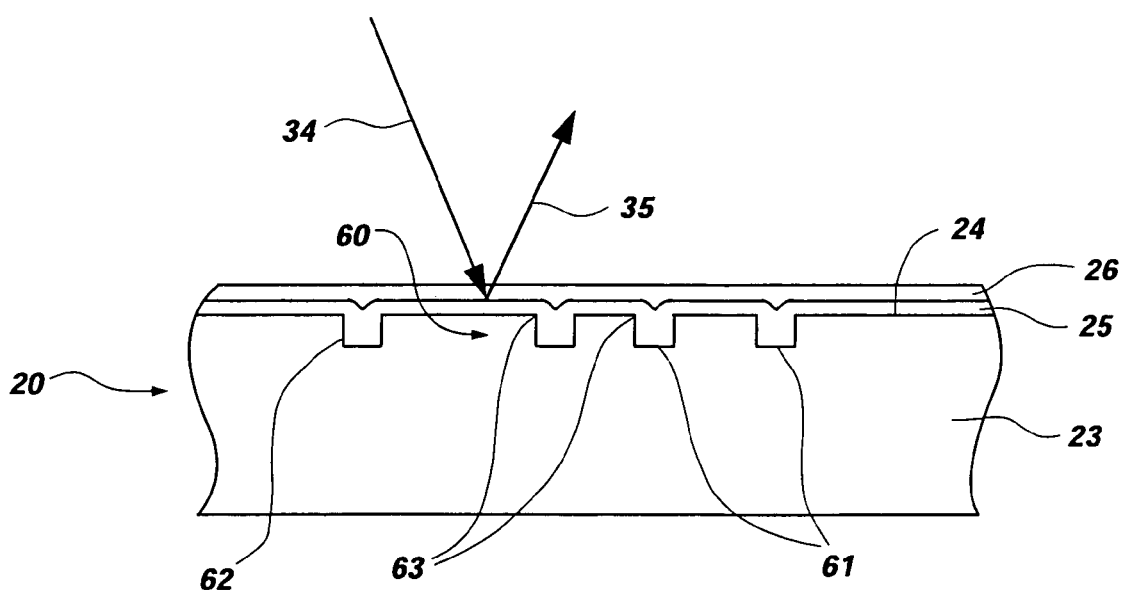
FIG. 3 is a cross-sectional representation of the substrate of FIG. 1 illustrating the direction of incident radiation thereon and the radiation reflected therefrom.

With reference to FIGS. 1 and 3, a wafer 20 including marks 60 formed in the substrate material 23 thereof is illustrated. Marks 60 are located on and area A of wafer 20 near an edge 22 thereof, opposite the portion of edge 22 where an orientation notch 21 is located. As depicted, marks 60 each include a series of circular holes 61. Each mark 60 includes a wall 62 that extends downwardly into substrate material 23. An edge 63 is formed at the junction of each wall 62 and an active surface 24 of substrate material 23.

FIG. 1 illustrates wafer 20 with two material layers 25, 26 located over active surface 24 of substrate material 23 and at least partially filling holes 61 that form marks 60. As the one or more material layers 25, 26 disposed over active surface 24 of substrate material 23 may comprise materials that are opaque or nearly opaque to visible wavelengths of electromagnetic radiation (i.e., visible light), such as polyimide, polysilicon, metal silicides, metal oxides, silicon nitrides, metal nitrides, resist coatings, or thin metal layers, or materials that have a similar appearance (e.g., color, translucence, etc.) to substrate material 23, one or both of layers 25, 26 may impede or prevent the detection of holes 61 and, thus, the identification of marks 60 by conventional methods that including directing light toward active surface 24.

Figure 2:
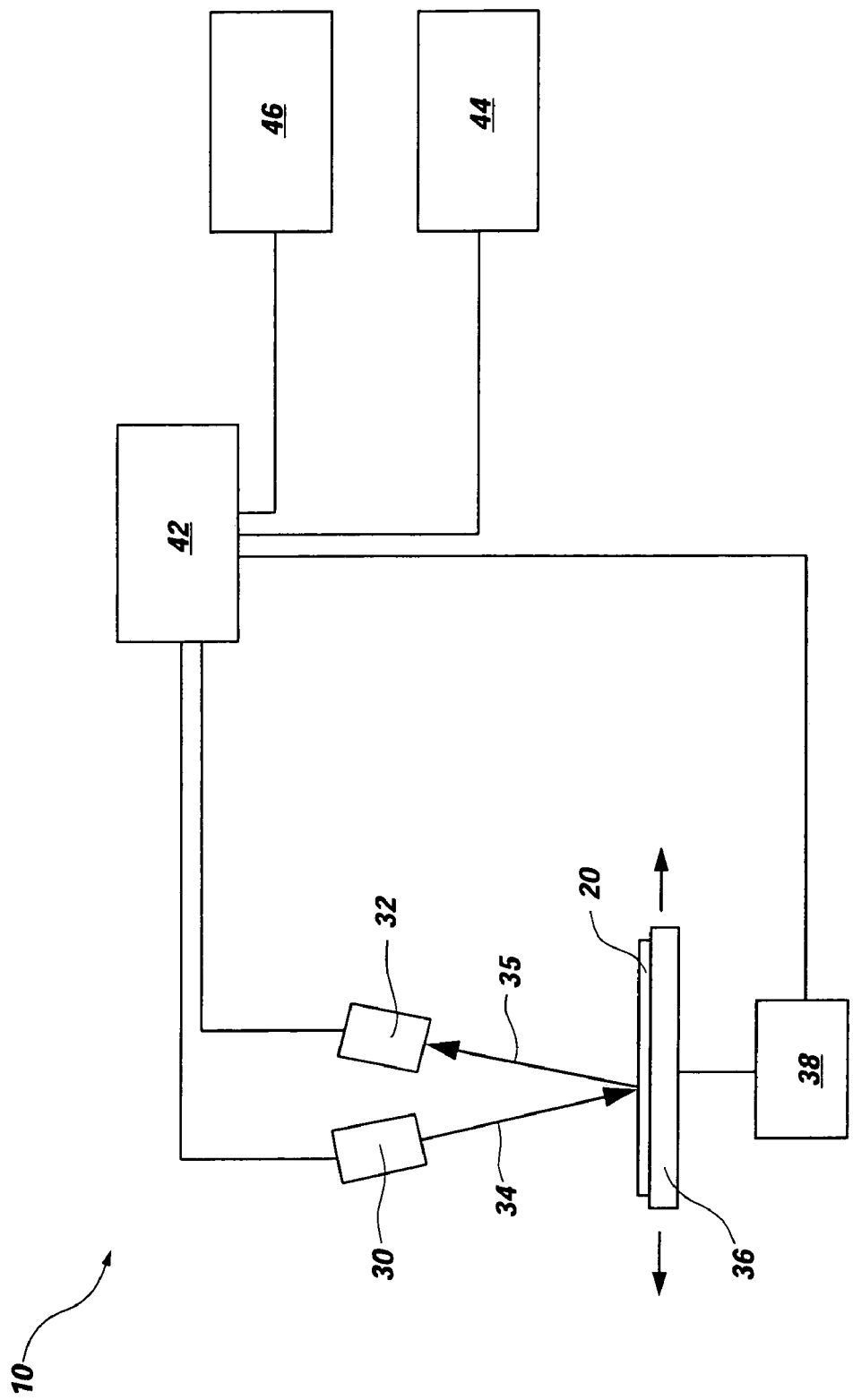
FIG. 2 is a schematic representation of a system incorporating teachings of the present invention.

FIG. 2 illustrates an identification system 10 that is configured to detect holes 61 and to identify marks 60 formed in a wafer 20, such as that illustrated in FIG. 1, or another large-scale substrate and covered by one or more material layers 25, 26. Identification system 10 is part of a larger system for routing wafers 20 or other large-scale substrates with different types of semiconductor devices being fabricated thereon to different fabrication process locations.

Identification system 10 includes a support structure 36 to which a wafer 20 or other substrate may be secured, a radiation source 30 oriented to direct electromagnetic incident radiation 34 of one or more wavelengths toward support structure 36, a reflectometer 32 positioned to receive electromagnetic radiation of one or more wavelengths reflected from support structure 36 or a wafer disposed thereon, which is also referred to herein as reflected radiation 36, and a processor 42 associated with reflectometer 32.

Radiation source 30 may include one or more sources of incident radiation 34. While radiation source 30 may emit electromagnetic incident radiation 34 of any wavelength that will be reflected by substrate material 23 (see FIG. 1) of wafer 20 or another substrate, it is preferred that identification system 10 include a radiation source 30 that emits incident radiation 34 of a plurality of wavelengths in the range of about 100 nm to about 1,000 nm. As an example, a radiation source 30 including a deuterium lamp and a tungsten-xenon (W—Xe) lamp would emit wavelengths over the broad range of about 140 nm to more than about 800 nm. Radiation sources 30 that emit incident radiation 36 including a plurality of wavelengths in other ranges (e.g., about 300 nm to about 780 nm, about 220 nm to about 800 nm, etc.) may also be used in identification system 10. Alternatively, identification system 10 may include a radiation source 30 that emits incident radiation 34 of a very narrow range of wavelengths (e.g., about 500 nm to about 550 nm) or of only a single wavelength (e.g., 550 nm).

Incident radiation 34 is preferably emitted from radiation source 30 in the form of a beam having a rectangular or circular cross section. The width of the beam (i.e., the distance across a cross-section of the beam, such as the diameter of a beam of circular cross section) is preferably about the same as the distance across a recessed feature of a mark formed in wafer 20, another substrate, or a layer of material disposed over wafer 20 or another substrate. The beam of incident radiation may, however, have any spot size (e.g., about 10 µm across, about 1 µm across, or smaller).

A particular radiation source 30 may be selected based on the ability of one or more wavelengths of incident radiation 34 emitted therefrom to at least occasionally penetrate one or more material layers formed over wafer 20 or another substrate and to be reflected by a material, such as silicon, gallium arsenide, or indium phosphide, of wafer 20 or of another large-scale substrate.

Radiation source 30 is preferably positioned to emit incident radiation 34 toward wafer 20 or another substrate at an angle that facilitates optimal reception of reflected radiation 35 by reflectometer. For example, if radiation source 30 and reflectometer 32 are positioned close to one another, radiation source 30 may be positioned so as to direct incident radiation 34 toward wafer 20 or other substrate at a nearly perpendicular angle thereto. Alternatively, if radiation source 30 and reflectometer 32 are spaced a greater distance apart from one another, radiation source 30 may be positioned so as to direct incident radiation 34 toward wafer 20 or another substrate at a more oblique angle thereto.

Reflectometer 32 is positioned so as to optimally receive reflected radiation 35 from wafer 20 or another substrate. Reflectometer 32 may be any known device capable of receiving reflected radiation 35 of wavelengths emitted by radiation source 30 and of measuring the intensity, or reflectance, of each wavelength of reflected radiation 35 relative to the intensity of incident radiation 34 of the same wavelength. As illustrated in greater detail in FIG. 3, the reflectance of reflected radiation 35 is typically different than the intensity of incident radiation 34, and depends upon the wavelength range of incident radiation 34 and reflected radiation 35, the absorption coefficients substrate material 23 of wafer 20 and of each of the material layers (e.g., layers 24, 26, 28, 30) formed thereon, and the distance incident radiation 34 and reflected radiation 35 travel through each material layer formed on substrate material 23. Reflectometer 32 may include a sensing element (not shown), as known in the art, such as a charge-coupled device (CCD) array, that separately measures the reflectance of each of the different wavelengths of reflected radiation 35.

With continued reference to FIG. 2, identification system 10 is configured so that incident radiation 34 from radiation source 30 may be scanned, preferably in a raster fashion, across a wafer 20 or other substrate disposed on support structure 36. In addition, reflectometer 32 of identification system 10 may be maintained at a fixed distance from radiation source 30 to facilitate reception of reflected radiation 35 during scanning of incident radiation 34 onto wafer 20. Such scanning may be effected with a support structure 36 capable of at least two-dimensional movement (i.e., along x and y axes) in a plane substantially parallel to the plane of the active surface of a wafer 20 or other substrate held by support structure 36, while radiation source 30 and reflectometer 32 remain in horizontally fixed positions. Support structure 36 may also be capable of movement along a third axis (i.e., the z-axis) relative to radiation source 30 and reflectometer 32 to facilitate focusing of incident radiation 34 on wafer 20 or another substrate. Actuation apparatus 38 for moving support structure 36 in two or more dimensions are known in the art and include, but are not limited to, DC-motors, stepper motors, and rotary hydraulic motors. Alternatively, radiation source 30 and reflectometer 32 may be moved along two or more axes relative to a fixed support structure 36 and a wafer 20 or other substrate supported thereby. As another alternative, each of support structure 36, radiation source 30, and reflectometer 32 may be moved along at least one axis to facilitate scanning or focusing of incident radiation 34 on a wafer 20 or other substrate.

Identification system 10 may also include a processor 42, such as a known computer microprocessor that includes known types of logic circuits. Processor 42, including the logic circuits thereof, may, under control of one or more programs, perform a variety of tasks, including analyzing the reflectance of each wavelength of reflected radiation 35, determining the locations on wafer 20 or another substrate which caused the reflectance of at least one wavelength of reflected radiation 35 to change, correlating data of the locations on wafer 20 or another substrate that caused a change in the reflectance of at least one wavelength of reflected radiation 35, and identifying a mark from the correlated data.

As a first example of the operation of processor 42, processor 42 may be associated with reflectometer 32 so as to receive information about the measured intensity, or reflectance of each wavelength of reflected radiation 35 from a specific location on wafer 20 or another substrate. A program directs processor 42 to convert the measured reflectance to data that may be analyzed by processor 42, utilized by processor 42 under control of a program, or output to a user. The reflectance of each wavelength of radiation 35 reflected from locations of wafer 20 or another substrate where neither marks nor semiconductor device structures are present will be identified by processor 42 as a baseline reflectance for that wavelength of reflected radiation 35. Processor 42 compares the measured reflectance of each wavelength of reflected radiation 35 to the corresponding baseline for that wavelength to determine whether the reflectances of any of the wavelengths of reflected radiation vary from their corresponding baselines for each scanned location.

In a second example, processor 42 may be associated with support structure 36 or actuation apparatus 38 therefor so as to receive data corresponding to a location on wafer 20 or another substrate from which radiation 35 was reflected. Processor 42 may, under control of a program, associate this locational data with data of the reflectance of radiation 35 reflected from each identified location of wafer 20 or another substrate. When correlated with the corresponding reflectance data generated in accordance with the preceding example, the program instructing processor 42 may identify the locations on wafer 20 or another substrate at which the reflectances of one or more wavelengths of reflected radiation varied from the corresponding baselines.

A third example of the use of processor 42 includes correlating data of the locations on wafer 20 or another substrate that caused a change in the reflectance of at least one wavelength of reflected radiation 35. Each of the locations where the measured reflectance of at least one wavelength of reflected radiation 35 varied from the baseline reflectance may be mapped to provide data about the character of one or more marks.

A fourth example of the use of processor 42 includes employing an optical character recognition (OCR) program to identify a characterized mark. Known optical character recognition systems, such as the plug-in marketed as ACU-READER/OCR II™ by Cognex Corporation of Natick, Mass., may be used to instruct processor 42.

Processor 42, under control of programming of a known type, may also direct the movement of support structure 36 or of radiation source 30 and reflectometer 32 to facilitate scanning of incident radiation 34 on wafer 20 or another substrate, as well as the measurement by reflectometer 32 of the reflectance of reflected radiation 35. Such scanning may be completely automated or controlled by way of a user interface 46, such as a computer keyboard, mouse, or touch pad, associated with processor 42.

Processor 42 may similarly control the wavelengths and intensity of incident radiation 34 directed onto wafer 20 or another substrate. These types of variations in incident radiation 34 may be caused, for example, by controlling the amount of power supplied to radiation source 30, by the use of filters to prevent certain wavelengths of radiation from source 30 from reaching wafer 20 or other substrate, and by selectively activating radiation sources 30 that emit radiation of different wavelengths or wavelength ranges.

A display 44, such as a printer, a video monitor, or another known data output device, may also be associated with processor 42 to provide a user of identification system 10 with information about the reflectances of radiation measured by reflectometer 32, the character of one or more marks 60 or a portion thereof determined by processor 42, or the identities of one or more marks 60 that have been determined by processor. Of course, processor 42 may also output other data to a display 44, including, without limitation, data regarding the wavelengths of incident radiation 34 directed onto wafer 20, the timing of the identification process, the type of semiconductor devices being fabricating on wafer 20, or the preceding and/or next fabrication stages for wafer 20.

Each of the foregoing uses of processor 42 may be effected by a single processor 42 or by separate, associated processors 42. Programming of processor 42 for each of these functions may be in the form of software or hardware programs.

FIG. 3 illustrates an example of the effects of directing incident radiation 34 onto a wafer 20 or other substrate with one or more layers 25, 26 over a mark 60 formed therein. Depending upon the type of material from which a layer or layers (e.g., layers 25, 26 shown in FIG. 1) overlying substrate material 23 is formed, some wavelengths of electromagnetic radiation will be reflected by the layer or layers, while all or portions of other wavelengths of incident radiation 34 may penetrate the layer or layers and be reflected by substrate material 23. A change in the intensity, or reflectance, of one or more of the wavelengths of reflected radiation 35 from baseline reflectance values for those wavelengths of radiation 35 reflected from the same substrate (e.g., wafer 20) with one or more layers of the same material or materials formed thereover may be caused by a variation in the thickness of one or more of the material layers or the presence of a recess, such as a hole 61, in active surface 24 of substrate material 23. Variations in the thickness of one or more material layers typically occur when the material layers are formed over a recess, such as hole 61, formed in active surface 24. Thus, when incident radiation is scanned over an area of wafer 20 where one or more marks 60 are believed to be located, such as area A, opposite notch 21 (FIG. 1), a change in the reflectance of one or more of the wavelengths of reflected radiation 35 from a baseline value may indicate the presence of a hole 61 in active surface 24.

The mark identification method of the present invention works best when at least the outermost layer 26 formed over a mark 60 in a wafer 20 or other substrate is at least partially transparent to at least one wavelength of incident radiation 34. Even thin metallization layers (e.g., layers of titanium, tungsten, copper, aluminum, and platinum having thicknesses of about 500 Å or less) may be at least partially transparent to one or more wavelengths of incident radiation 34.

FIGS. 4–10 further illustrate the use of incident radiation 34 of one or more wavelengths and of the measurement of reflected radiation 35 and the analysis of deviation in the intensity, or reflectance, patterns of one or more wavelengths of reflected radiation 35 to detect a mark 60 (see FIG. 1) or portion thereof (e.g., a hole 61) through one or more material layers formed over mark 60.

Figure 4:
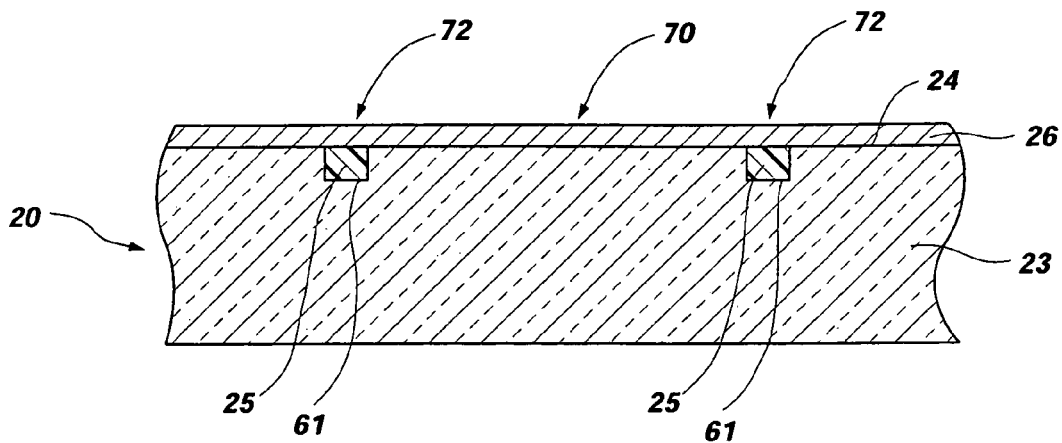
FIG. 4 is a cross-sectional representation of a substrate including holes recessed in the active surface thereof, a first material disposed in the holes, and a layer of a second material disposed over both the active surface and the first material.

Turning to FIG. 4, a wafer 20 including a substrate material 23 of silicon with two material layers 25, 26 thereon is depicted. While layer 25 fills holes 61 formed in active surface 24 of substrate material 23 without substantially covering active surface 24, layer 26 covers layer 25 and active surface 24. As illustrated, layer 25 is a silicon oxide layer having a thickness of about 1,000 Å, while layer 26 is formed from tungsten silicide ($WSi_x$) and has a thickness of about 1,250 Å. As incident radiation 34 of a wavelength range of about 250 nm to about 750 nm is directed toward locations 70 and 72 of wafer 20, different intensities, or reflectances, are measured by reflectometer 32 (see FIG. 2) for some of the wavelengths of reflected radiation 35.

Figure 5:
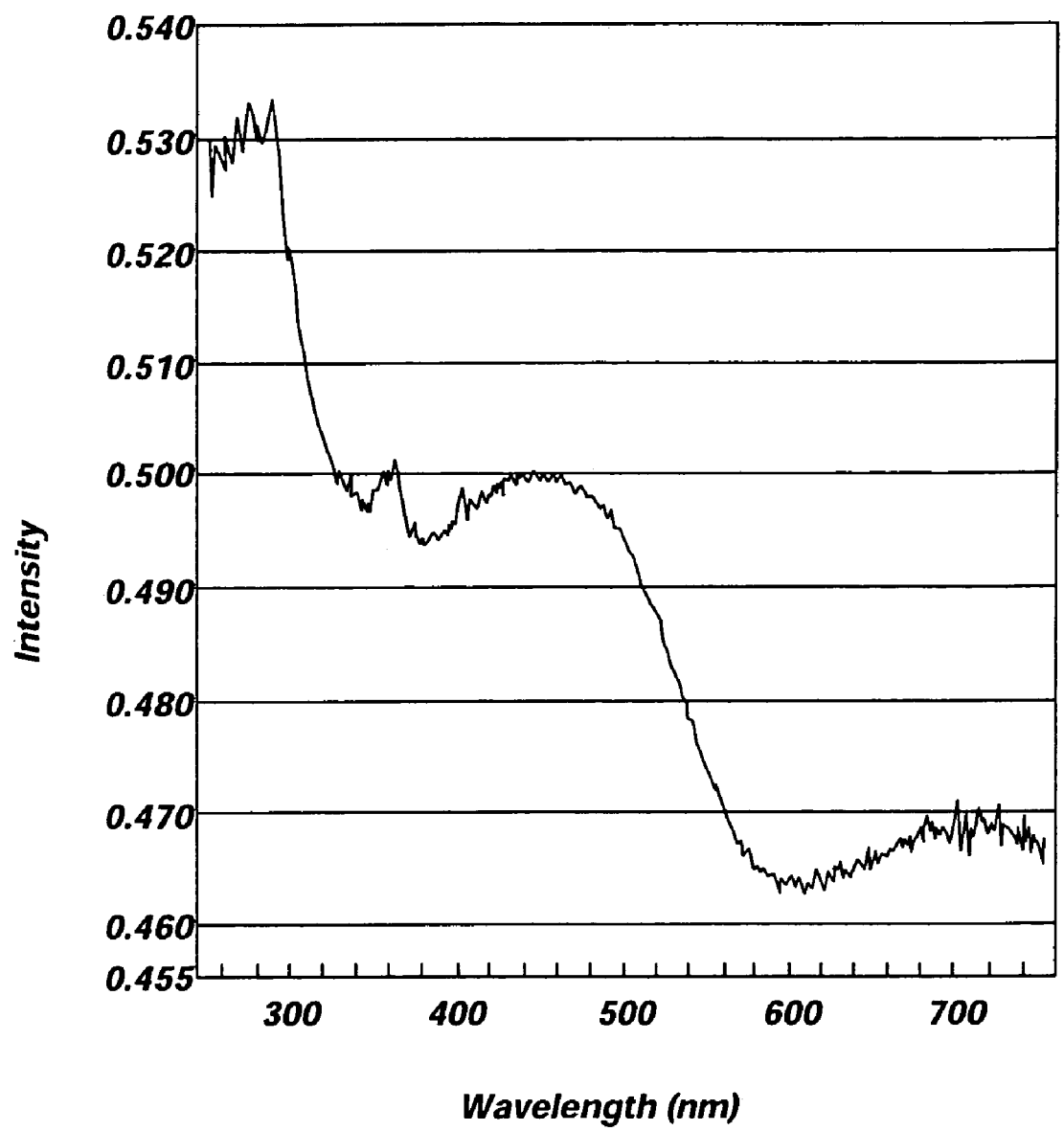
FIG. 5 is a graph illustrating the reflectance of various wavelengths of radiation reflected from a first location of the substrate depicted in FIG. 4.
Figure 6:
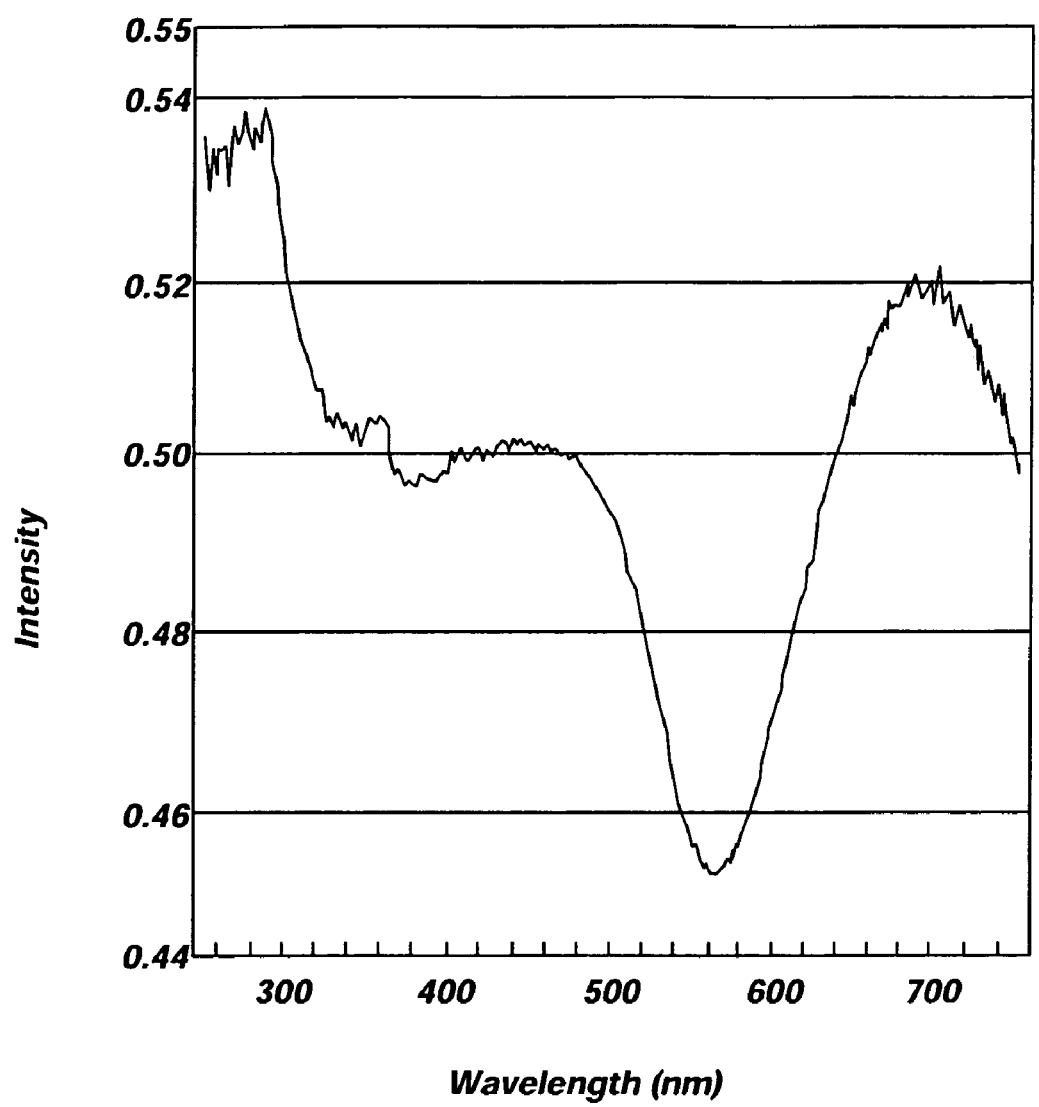
FIG. 6 is a graph illustrating the reflectance of various wavelengths of radiation reflected from a second location of the substrate depicted in FIG. 4.

FIG. 5 graphically depicts the measured reflectance for various wavelengths of radiation 34, 35 directed toward and reflected from location 70 of wafer 20, which is a location at which layer 26 directly contacts active surface 24 of substrate material 23. FIG. 6 shows the measured reflectance for various wavelengths of radiation 34, 35 directed toward and reflected from location 72 of wafer 20, which is a location where layer 26 overlies material 25-filled holes 61 formed in active surface 24 of substrate material 23. As can be seen by comparing the reflectance patterns illustrated in FIGS. 5 and 6, as incident radiation 34 (see, e.g., FIG. 3) is scanned in a direction parallel to a plane of wafer 20 from location 70 to location 72 (see FIG. 4), the intensity, or reflectance, of reflected radiation 35 of various wavelengths changes (particularly at wavelengths of about 550 nm and greater), indicating the presence of a hole 61 or other recess in active surface 24.

Figure 7:
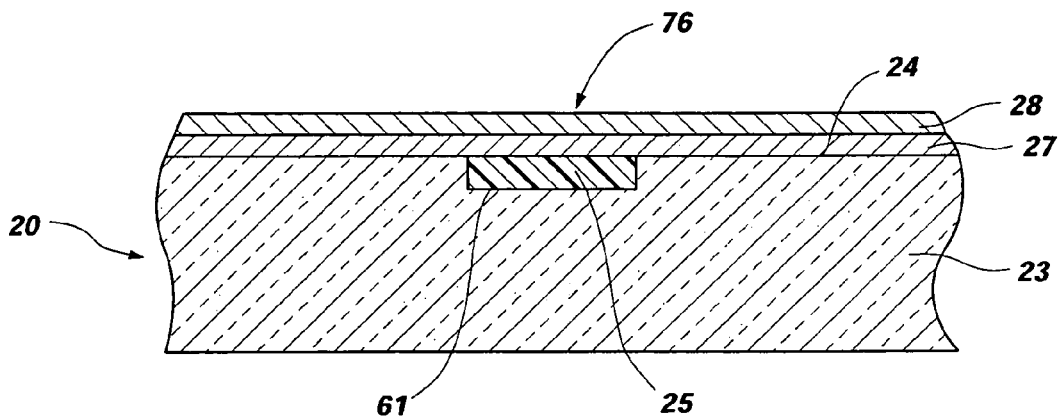
FIG. 7 is cross-sectional representation of a substrate including a hole recessed in the active surface thereof and different materials disposed in the hole and in layers over the active surface of the substrate.

By way of further example, FIG. 7 shows a wafer 20 with a silicon substrate material 23, a hole 61 formed in active surface 24 of substrate material 23, a first material layer 25 substantially filling hole 61 without covering active surface 24, a second material layer 27 covering first material layer 25 and active surface 24, and a third material layer 28 disposed over second material layer 27. Layer 25 may comprise silicon oxide and have a thickness of about 90 Å. Layer 27 may comprise polysilicon and have a thickness of about 850 Å. Layer 28 may comprise tungsten silicide ($WSi_x$) and have a thickness of about 1,250 Å.

Figure 9:
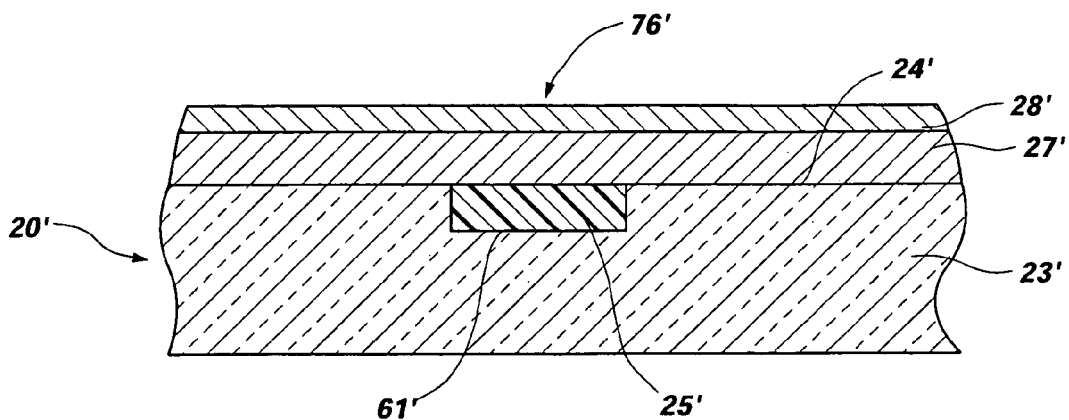
FIG. 9 is a cross-sectional representation of another substrate including a hole in substantially the same location as the substrate depicted in FIG. 7, with the same material being disposed in the hole and layers of the same materials disposed over the active surface of the substrate, each of the layers having different thicknesses than the layers of the substrate shown in FIG. 7.

FIG. 9 illustrates a wafer 20' with layers 25', 27', and 28' formed from the same materials as layers 25, 27, and 28, respectively, depicted in FIG. 7. The thicknesses of layers 25', 27', and 28' differ from the thicknesses of layers 25, 27, and 28, however, with layer 25 having a thickness of about 1,000 Å, layer 27 having a thickness of about 4,000 Å, and layer 28 having a thickness of about 1,250 Å.

Figure 8:
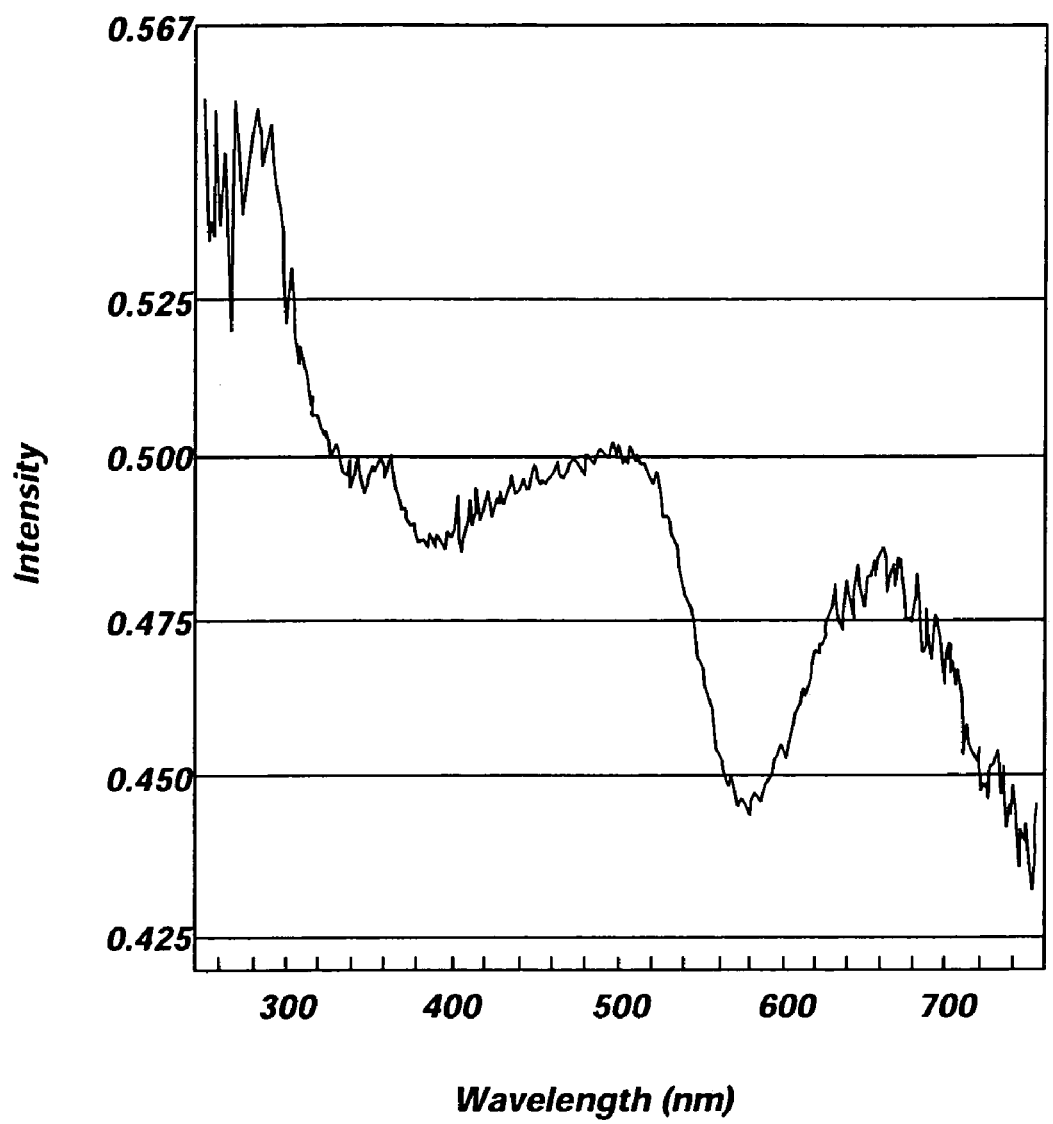
FIG. 8 is a graph illustrating the reflectance of various wavelengths of radiation reflected from a specific location of the substrate shown in FIG. 7.
Figure 10:
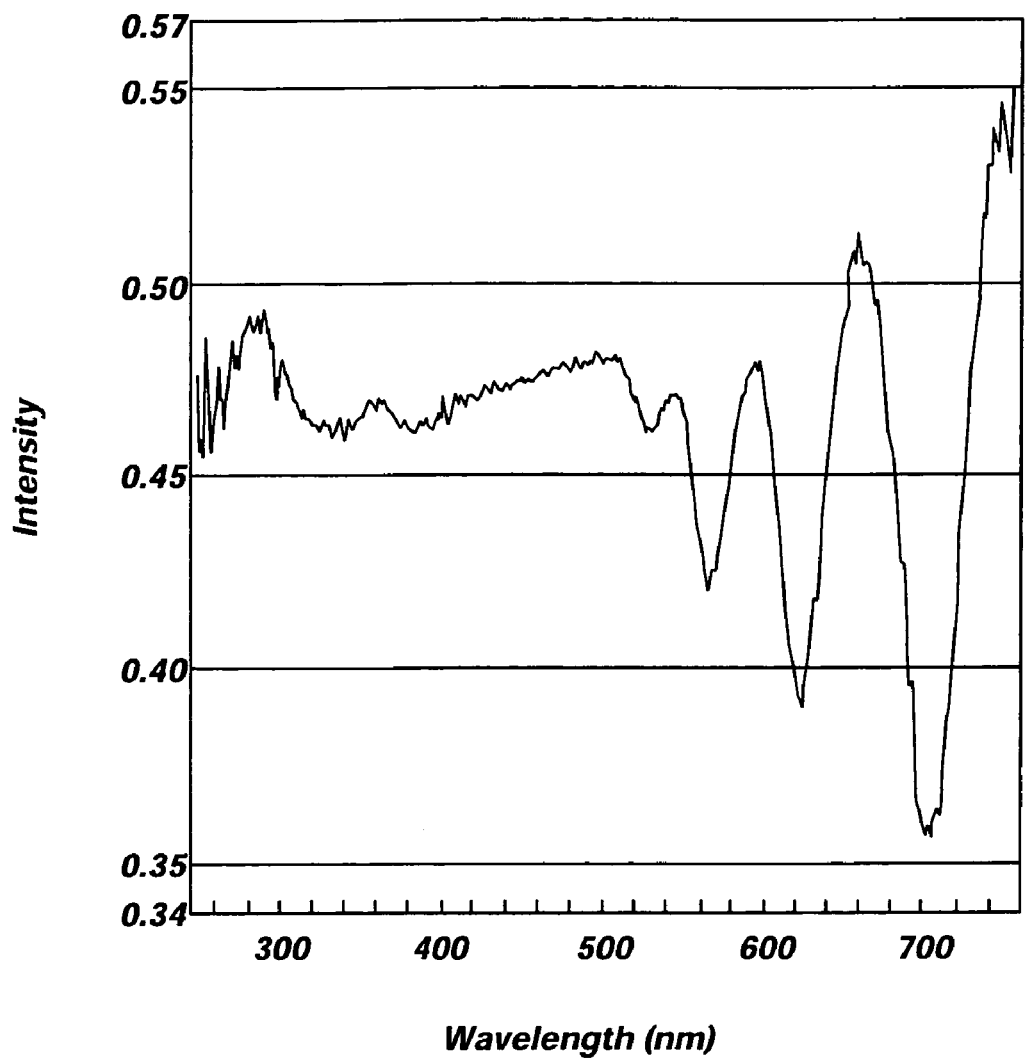
FIG. 10 is a graph illustrating the reflectance of various wavelengths of radiation reflected from a specific location of the substrate shown in FIG. 9, which corresponds to the specific location from which radiation was reflected from the substrate depicted in FIG. 7.

FIG. 8 graphically depicts the measured reflectances for various wavelengths of radiation 34, 35, respectively, directed toward and reflected from location 76 of wafer 20, where layers 27 and 28 overlie material 25-filled holes 61 formed in active surface 24 of substrate material 23. FIG. 10 graphically depicts the measured reflectances for various wavelengths of radiation 34, 35 directed toward and reflected from location 76' of wafer 20', where layers 27' and 28' overlie material 25'-filled holes 61' formed in active surface 24' of the substrate material 23' thereof A comparison of FIGS. 8 and 10 shows that the measured intensities, or reflectances, of a number of wavelengths of radiation 35 reflected from corresponding locations 76, 76' of wafers 20, 20', respectively, vary significantly. These variations are caused primarily by differences in the thicknesses of one or more of the material layers formed over wafers 20 and 20'.

An example of the use of identification system 10 is explained with reference to FIGS. 1–3. To begin, a wafer 20 such as that illustrated in FIG. 1 is placed upon support structure 36, shown in FIG. 2. While FIG. 2 illustrates a single wafer being disposed upon support structure 36, the support structure may be a wafer carrier or other apparatus by which one or more wafers 20 or other large-scale substrates are carried during conventional semiconductor device fabrication processes. Furthermore, although FIG. 2 illustrates wafer 20 as being oriented in a substantially horizontal position, identification system 20 may be used to identify one or more marks 60 on wafers 20 that are not horizontally oriented (i.e., that are vertically or otherwise oriented).

Radiation source 30 emits incident radiation 32 of one or more wavelengths toward an area of wafer 20 where a mark 60 is believed to be located, typically opposite notch 21. The wavelengths of incident radiation 34, as well as the intensities of these wavelengths, may be controlled by processor 42. Incident radiation 34 may include wavelengths to which at least one of the material layers (e.g., layers 25, 26) formed over wafer 20 is at least partially transparent. Stated another way, one or more of the wavelengths of incident radiation 34 will at least occasionally pass through one or more of the material layers formed over wafer 20.

Radiation 35 reflected by substrate material 23 of wafer 20 or by a material layer, such as layers 25, 26 on wafer 20, is received by reflectometer 32, which measures the intensity, or reflectance, of reflected radiation 35. Generally, the intensity, or reflectance, of a wavelength of radiation changes as it passes through a material. Reflectance typically varies when the thickness of the material through which the wavelength of radiation changes.

Processor 42 receives intensity signals from reflectometer 32, as well as signals that indicate the location of wafer 20 from which radiation 35 was reflected, which are also referred to herein as locational signals. The intensity signals may be used by processor 42 to generate intensity data, while the locational signals may be used by processor 42 to generate locational data. The generated intensity data that may be compared to baseline intensity data for corresponding wavelengths of reflected radiation 35. If the generated intensity data differ from the baseline intensity data, processor 42 may store locational data to indicate a location on wafer 20 where a hole 61 is located. In addition, in order to confirm the presence of a hole 61 at a location where a the measured intensity data differed from the baseline intensity data, the intensity data may be compared to known intensity data, such as intensity data for a layer of a particular material and of a particular thickness or known intensity data that corresponds to the presence of a hole 61 or other recess in the same type of substrate material 23.

The position of either support structure 36 or of radiation source 30 is moved (e.g., under control of processor 42) to effect scanning of incident radiation 34 onto another location of wafer 20. The subsequent processes are then repeated to determine whether a hole 61 is present on the next location of wafer 20. Each of these processes are repeated until an area A (FIG. 1) where one or more marks 60 are believed to be located has been substantially completely scanned with incident radiation 34 and reflected radiation 35 from each of the scanned locations of that area has been measured.

Once area A or another area of wafer 20 has been at least partially scanned, processor 42 may correlate or map the data of each of the stored locations of the scanned portion of wafer 20 to provide data regarding the character of one or more marks 60 or a portion thereof. The character of the mark or marks 60 or portion thereof is then analyzed (e.g., by processor 42 or by another processor) by use of the OCR program to identify the mark or marks 60 formed in wafer 20.

When the mark or marks 60 of wafer 20 have been identified, wafer 20 may be sent to the next appropriate process location under control of a processor (e.g., processor 42) or otherwise as known in the art.

Of course, data generated by one or more processors (e.g., processor 42) associated with identification system 10 may be output to one or more associated displays 44 at any time during the identification process.

Identification system 10 (FIG. 1) may be used to identify one or more marks 60 or portions thereof formed in a wafer 20 during various stages of the semiconductor device fabrication process. Identification system 10 is particularly useful for identifying marks 60 on wafers 20 following material layer deposition processes and prior to patterning one or more material layers that have been formed over wafer 20.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for identifying a type of semiconductor device being fabricated on a substrate by evaluating an identification mark comprising at least one recess in the substrate surface through at least one layer formed over the mark, comprising:

scanning electromagnetic radiation of at least one wavelength across at least a portion of the substrate including the at least one recess, the at least one wavelength at least partially penetrating at least one layer of a material opaque to visible wavelengths of electromagnetic radiation to an identifying mark embedded within materials that are opaque to visible wavelengths of electromagnetic radiation;

measuring an intensity of radiation of the at least one wavelength reflected by different locations of the at least a portion of the substrate;

detecting locations at which the intensity changes from substantially a baseline intensity; and correlating each location at which the intensity changes from substantially the baseline intensity to at least one characteristic which distinguishes characters of the identification mark from other features on or in the substrate to reveal the identification mark and to identify the type of semiconductor device being fabricated on the substrate.

2. The method of claim 1, wherein scanning comprises raster scanning the electromagnetic radiation.

3. The method of claim 1, wherein scanning is effected over at least a portion of a wafer comprising semiconductor material where the identification mark is located.

4. The method of claim 1, wherein scanning comprises scanning electromagnetic radiation comprising a plurality of wavelengths across at least the portion of the substrate.

5. The method of claim 4, wherein measuring comprises measuring intensities of reflected radiation of each of the plurality of wavelengths.

6. The method of claim 1, wherein scanning comprises scanning electromagnetic radiation of wavelengths of about 100 nm to about 1,000 nm across the at least a portion of the substrate.

7. The method of claim 1, wherein scanning comprises scanning electromagnetic radiation of wavelengths of about 190 nm to about 800 nm across the at least a portion of the substrate.

8. The method of claim 1, wherein scanning comprises scanning electromagnetic radiation of a wavelength of at least about 140 nm across the at least a portion of the substrate.

9. The method of claim 1, wherein scanning comprises scanning electromagnetic radiation of wavelengths of about 220 nm to about 800 nm across the at least a portion of the substrate.

10. The method of claim 1, wherein scanning comprises scanning electromagnetic radiation of wavelengths of about 300 nm to about 780 nm across the at least a portion of the substrate.

11. The method of claim 1, wherein scanning comprises scanning electromagnetic radiation of a wavelength of about 550 nm across at the least a portion of the substrate.

12. The method of claim 1, wherein scanning is effected from above the substrate.

13. The method of claim 1, wherein scanning is effected at a non-perpendicular angle relative to the substrate.

14. The method of claim 1, wherein scanning comprises moving a source of the electromagnetic radiation relative to the substrate.

15. The method of claim 1, wherein scanning comprises moving the substrate relative to a source of the electromagnetic radiation.

16. The method of claim 1, wherein measuring the intensity is effected using a reflectometer.

17. The method of claim 1, wherein detecting comprises identifying a location of the substrate from which the electromagnetic radiation was reflected.

18. The method of claim 1, wherein detecting comprises identifying a location of the substrate to which the electromagnetic radiation was directed.

19. The method of claim 1, wherein correlating comprises mapping at least each location at which the intensity of electromagnetic radiation reflected from the substrate varied from the baseline intensity.

20. The method of claim 19, wherein correlating further comprises recognizing the identification mark based at least in part on mapping.

21. A method for determining a destination for a semiconductor device substrate, comprising:

identifying an identification mark comprising at least one recess defining a character within a surface of the semiconductor device substrate and embedded material opaque to visible wavelengths of electromagnetic radiation by:

scanning electromagnetic radiation of at least one wavelength across at least a portion of the semiconductor device substrate including the at least one recess, the at least one wavelength capable of at least partially penetrating the material;

measuring an intensity of radiation of the at least one wavelength reflected by different locations of the at least a portion of the semiconductor device substrate;

detecting locations at which the intensity changes from substantially a baseline intensity; and correlating each location at which the intensity changes to identify the mark; and identifying a predetermined destination for the semiconductor device substrate based on the identification mark.

22. The method of claim 21, wherein scanning comprises raster scanning the electromagnetic radiation.

23. The method of claim 21, wherein scanning is effected over at least a portion of the semiconductor device substrate comprising semiconductor material where the identification mark is located.

24. The method of claim 21, wherein scanning comprises scanning electromagnetic radiation comprising a plurality of wavelengths across at least the portion of the semiconductor device substrate.

25. The method of claim 24, wherein measuring comprises measuring intensities of reflected radiation of each of the plurality of wavelengths.

26. The method of claim 21, wherein scanning comprises scanning electromagnetic radiation of wavelengths of about 100 nm to about 1,000 nm across the at least a portion of the semiconductor device substrate.

27. The method of claim 21, wherein scanning comprises scanning electromagnetic radiation of wavelengths of about 190 nm to about 800 nm across the at least a portion of the semiconductor device substrate.

28. The method of claim 21, wherein scanning comprises scanning electromagnetic radiation of a wavelength of at least about 140 nm across the at least a portion of the semiconductor device substrate.

29. The method of claim 21, wherein scanning comprises scanning electromagnetic radiation of wavelengths of about 220 nm to about 800 nm across the at least a portion of the semiconductor device substrate.

30. The method of claim 21, wherein scanning comprises scanning electromagnetic radiation of wavelengths of about 300 nm to about 780 nm across the at least a portion of the semiconductor device substrate.

31. The method of claim 21, wherein scanning comprises scanning electromagnetic radiation of a wavelength of about 550 nm across the at least a portion of the semiconductor device substrate.

32. The method of claim 21, wherein scanning is effected from above the semiconductor device substrate.

33. The method of claim 21, wherein scanning is effected at a non-perpendicular angle relative to the semiconductor device substrate.

34. The method of claim 21, wherein scanning comprises moving a source of the electromagnetic radiation relative to the semiconductor device substrate.

35. The method of claim 21, wherein scanning comprises moving the semiconductor device substrate relative to a source of the electromagnetic radiation.

36. The method of claim 21, wherein measuring the intensity is effected using a reflectometer.

37. The method of claim 21, wherein detecting comprises identifying a location of the semiconductor device substrate from which the electromagnetic radiation was reflected.

38. The method of claim 21, wherein detecting comprises identifying a location of the semiconductor device substrate to which the electromagnetic radiation was directed.

39. The method of claim 21, wherein correlating comprises mapping at least each location at which the intensity of electromagnetic radiation reflected from the semiconductor device substrate varied from the baseline intensity.

40. The method of claim 39, wherein correlating further comprises recognizing the identification mark based at least in part on the mapping.

41. A system for identifying a marking on a substrate indicative of a type of semiconductor device being fabricated on the substrate and at least partially covered by at least one layer of material, comprising:
- at least one radiation source configured and positioned to direct electromagnetic radiation of at least one wavelength toward a substrate, the at least one wavelength capable of at least partially penetrating a material opaque to visible wavelengths of electromagnetic radiation;
- at least one reflectometer positioned so as to receive electromagnetic radiation of the at least one wavelength reflected from a location of the substrate covered with a material opaque to visible wavelengths of electromagnetic radiation; and
- at least one processor associated with the reflectometer for analyzing a pattern of intensities of electromagnetic radiation of the at least one wavelength reflected from a plurality of locations of the substrate and for correlating the pattern of intensities to a known identifier associated with the marking and to the type of semiconductor device being fabricated on the substrate.

42. The system of claim 41, wherein the at least one processor includes at least one logic circuit for comparing the intensity of the at least one wavelength of radiation reflected from the location of the substrate to a baseline intensity, the logic circuit being under control of at least a portion of at least one program.

43. The system of claim 42, wherein the at least one logic circuit for comparing the intensity also effects storing in memory at least one location of the substrate where the intensity of the at least one wavelength of radiation reflected from the substrate varies from the baseline intensity.

44. The system of claim 43, wherein the at least one processor includes at least one logic circuit for mapping at least locations of the substrate where an intensity of the at least one wavelength of reflected electromagnetic radiation varies from the baseline intensity, the at least one logic circuit for mapping being under control of at least a portion of at least one program.

45. The system of claim 44, wherein the at least one processor includes at least one logic circuit for identifying the surface feature based on a mapped plurality of locations where an intensity of the at least one wavelength of reflected electromagnetic radiation varies from the baseline intensity, the at least one logic circuit for identifying being under control of at least a portion of at least one program.

46. The system of claim 41, further comprising an actuation apparatus for effecting movement of at least one of the substrate and the at least one radiation source.

47. The system of claim 41, wherein the at least one radiation source is configured to direct incident radiation of a plurality of wavelengths onto at least a portion of the substrate.

48. The system of claim 47, wherein the at least one reflectometer is configured to measure intensities of reflected radiation of each of the plurality of wavelengths.

49. The system of claim 41, wherein the at least one radiation source is configured to emit incident radiation of wavelengths of about 100 nm to about 1,000 nm.

50. The system of claim 41, wherein the at least one radiation source is configured to emit incident radiation of wavelengths of about 190 nm to about 800 nm.

51. The system of claim 41, wherein the at least one radiation source is configured to emit incident radiation of a wavelength of at least about 140 nm.

52. The system of claim 41, wherein the at least one radiation source is configured to emit incident radiation of wavelengths of about 220 nm to about 800 nm.

53. The system of claim 41, wherein the at least one radiation source is configured to emit incident radiation of wavelengths of about 300 nm to about 780 nm.

54. The system of claim 41, wherein the at least one radiation source is configured to emit incident radiation of a wavelength of about 550 nm.

55. The system of claim 41, wherein the at least one radiation source is positioned to emit incident radiation toward an active surface of the substrate.

56. The system of claim 41, wherein the at least one radiation source is positioned to emit incident radiation toward an active surface of the substrate at a non-perpendicular angle thereto.

57. The system of claim 41, further comprising a user interface associated with the at least one processor.

58. The system of claim 41, further comprising at least one output device associated with the at least one processor.

59. A processor for characterizing at least one material-covered recessed marking formed in a substrate embedded within material opaque to visible wavelengths of radiation for identifying a type of semiconductor device being fabricated on the substrate, comprising:
- at least one logic circuit for comparing a measured intensity of at least one wavelength of reflected radiation to a baseline intensity of the at least one wavelength of radiation reflected from a planar portion of the substrate and through at least one material layer that is opaque to visible wavelengths of electromagnetic radiation; and
- at least one logic circuit for mapping a plurality of locations of the substrate where the measured intensity differs from the baseline intensity, the at least one logic circuit being under control of at least a portion of at least one program, a map resulting from the mapping comprising a digital image of characters of the recessed marking; and
- at least one logic circuit for identifying a type of semiconductor device that corresponds to the mapped locations.

60. The processor of claim 59, further comprising:
at least one logic circuit for characterizing the at least one material-covered recess based on the plurality of locations mapped by the at least one logic circuit for mapping, the at least one logic circuit for characterizing being under control of at least a portion of at least one program.

* * * * *